(12) United States Patent
Bi et al.

(10) Patent No.: US 10,332,986 B2
(45) Date of Patent: Jun. 25, 2019

(54) FORMATION OF INNER SPACER ON NANOSHEET MOSFET

(71) Applicant: International Business Machines Corporation, Armonk, NY (US)

(72) Inventors: Zhenxing Bi, Niskayuna, NY (US); Kangguo Cheng, Schenectady, NY (US); Juntao Li, Cohoes, NY (US); Peng Xu, Guilderland, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/243,246

(22) Filed: Aug. 22, 2016

(65) Prior Publication Data
US 2018/0053837 A1  Feb. 22, 2018

(51) Int. Cl.
| H01L 29/66 | (2006.01) |
| H01L 21/02 | (2006.01) |
| H01L 21/311 | (2006.01) |
| B82Y 10/00 | (2011.01) |
| H01L 29/06 | (2006.01) |
| H01L 29/775 | (2006.01) |

(52) U.S. Cl.
CPC ........ *H01L 29/66818* (2013.01); *B82Y 10/00* (2013.01); *H01L 21/0217* (2013.01); *H01L 21/02236* (2013.01); *H01L 21/02252* (2013.01); *H01L 21/02326* (2013.01); *H01L 21/31116* (2013.01); *H01L 29/0653* (2013.01); *H01L 29/0665* (2013.01); *H01L 29/6653* (2013.01); *H01L 29/66439* (2013.01); *H01L 29/66553* (2013.01); *H01L 29/775* (2013.01)

(58) Field of Classification Search
CPC ......... H01L 29/66818; H01L 21/02236; H01L 29/66553; H01L 21/02252; H01L 21/31116; H01L 21/0217; H01L 21/02326; H01L 29/6653

See application file for complete search history.

(56) References Cited

U.S. PATENT DOCUMENTS

| 5,412,246 | A | 5/1995 | Dobuzinsky et al. |
| 7,075,150 | B2 | 7/2006 | Boyd et al. |
| 8,753,942 | B2 | 6/2014 | Kuhn et al. |
| 8,969,149 | B2 | 3/2015 | Leobandung |
| 9,123,567 | B2 | 9/2015 | Radosavljevic et al. |
| 2006/0177977 | A1* | 8/2006 | Chan ............... H01L 21/0337 438/238 |
| 2008/0135949 | A1* | 6/2008 | Lo ................... B82Y 10/00 257/401 |

(Continued)

OTHER PUBLICATIONS

List of IBM Patents or Patent Applications Treated as Related, U.S. Appl. No. 15/243,246, filed Aug. 22, 2016, 2 Pages.

(Continued)

*Primary Examiner* — Mohammed R Alam
(74) *Attorney, Agent, or Firm* — Cantor Colburn LLP; Vazken Alexanian

(57) ABSTRACT

A method of forming a field effect transistor (FET) includes performing an oxidation on a nanosheet structure having alternating sheets of silicon and silicon germanium. An oxide etch is performed to remove portions of the sheets of silicon germanium. Other embodiments are also described herein.

9 Claims, 10 Drawing Sheets

(56) References Cited

U.S. PATENT DOCUMENTS

| | | | |
|---|---|---|---|
| 2010/0295024 A1* | 11/2010 | Pernel | B82Y 10/00 257/24 |
| 2013/0102120 A1* | 4/2013 | Seo | H01L 45/06 438/381 |
| 2014/0001441 A1 | 1/2014 | Kim et al. | |
| 2014/0183633 A1* | 7/2014 | Chen | H01L 29/7855 257/347 |
| 2014/0326952 A1 | 11/2014 | Kuhn et al. | |
| 2015/0295084 A1 | 10/2015 | Obradovic et al. | |
| 2016/0071729 A1 | 3/2016 | Hatcher et al. | |
| 2016/0111495 A1* | 4/2016 | Brand | H01L 29/0673 438/283 |
| 2016/0225637 A1* | 8/2016 | Takahashi | H01L 21/3065 |
| 2016/0359043 A1* | 12/2016 | Chen | H01L 29/7851 |
| 2017/0040531 A1* | 2/2017 | Chung | H01L 43/12 |

OTHER PUBLICATIONS

U.S. Appl. No. 15/368,089, filed Dec. 2, 2016, "Forming Stacked Nanowire Semiconductor Device".
U.S. Appl. No. 15/008,615, filed Jan. 28, 2016, "Forming Stacked Nanowire Semiconductor Device".
U.S. Appl. No. 14/846,428, filed Sep. 4, 2015, "Atomic Layer Deposition Sealing Integration for Nanosheet Complementary Metal Oxide Semiconductor With Replacement Spacer".
U.S. Appl. No. 15/254,394, filed Sep. 1, 2016.
U.S. Appl. No. 15/254,442, filed Sep. 1, 2016.
List of IBM Patents or Patent Applications Treated as Related; Date Filed: Aug. 22, 2016, 2 pages.
Bergendahl et al., "Forming Stacked Nanowire Semiconductor Device," U.S. Appl. No. 15/008,615, filed Jan. 28, 2016.
Craciun et al., "Microstructure of oxidized layers formed by the low-temperature ultraviolet-assisted dry oxidation of strained Si0.8Ge0.2 layers on Si," Journal of Applied Physics, vol. 75, No. 4, 1994, pp. 1972-1976.
Doris et al., "Atomic Layer Deposition Sealing Integration for Nanosheet Complementary Metal Oxide Semiconductor With Replacement Spacer," U.S. Appl. No. 14/846,428, filed Sep. 4, 2015.
List of IBM Patents or Patent Applications Treated as Related; Date Filed: Aug. 22, 2016, pp. 1-2.
Bi et al., "Formation of Inner Spacer on Nanosheet MOSFET," U.S. Appl. No. 15/915,238, filed Apr. 23, 2018.
IBM "List of IBM Patents or Patent Applications Treated as Related; (Appendix P)", Filed Apr. 23, 2018, 2 pages.

* cited by examiner

FORMATION OF INNER SPACER ON NANOSHEET MOSFET

BACKGROUND

This patent application relates in general to integrated circuit device structures and their fabrication. More specifically, the patent application relates to the fabrication and resulting structures of transistors with inner spacers formed using low temperature plasma oxidation.

In some configurations of a nanosheet metal oxide semiconductor field effect transistor (MOSFET), an inner spacer protects the nanosheet channel from the source and drain regions and provides electric isolation and support between the channels. Existing methods of creating an inner spacer can result in poor profile control during etching (such as HF-HCL or reactive ion etch (RIE)). Existing methods of creating an inner spacer can also result in etch-back in the spacer.

SUMMARY

Described herein is a method of forming portions of a transistor in an integrated circuit device. In one or more embodiments, the method includes receiving or forming a nanosheet structure having alternating sheets of silicon and silicon germanium. An oxidation is performed on the alternating sheets of silicon and silicon germanium, and an oxide etch is performed to remove portions of the sheets of silicon germanium.

Embodiments are also directed to a method that includes depositing a hard mask layer on a nanosheet structure. The hard mask layer is oxidized. Portions the hard mask layer are removed to reveal areas of the nanosheet structure to be etched. The revealed areas are etched, and the hard mask layer is removed.

Embodiments are also directed to a field effect transistor (FET). The FET includes a nanosheet channel region and a gate region around the nanosheet channel region. The nanosheet channel region is formed by forming a nanosheet structure having alternating sheets of silicon and silicon germanium. An oxidation is performed on the alternating sheets of silicon and silicon germanium. An oxide etch is performed to remove portions of the sheets of silicon germanium.

Additional features are realized through the techniques of the present invention. Other embodiments are described in detail herein and are considered a part of the claimed invention. For a better understanding of the invention with the features, refer to the description and to the drawings.

BRIEF DESCRIPTION OF THE DRAWINGS

The subject matter which is regarded as the invention is particularly pointed out and distinctly claimed in the claims at the conclusion of the specification. The forgoing features are apparent from the following detailed description taken in conjunction with the accompanying drawings in which:

DETAILED DESCRIPTION

It is understood in advance that although a detailed description of an exemplary spacer formation is included, implementation of the teachings recited herein are not limited to the particular structure described herein. Rather, embodiments of the present invention are capable of being implemented in conjunction with any other type of integrated circuit device, now known or later developed.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

As used herein, the terms "invention" or "present invention" are non-limiting terms and not intended to refer to any single aspect of the particular invention but encompass all possible aspects as described in the specification and the claims.

Described herein is a method of forming transistors with an inner spacer formed using a novel technique. Turning now to an overview of embodiments of the present invention, one or more embodiments provide a methodology for forming an inner spacer using low temperature plasma oxidation. In addition, oxidation of a hard mask layer transforms SiN to SiON, which has a higher etch resistance, resulting in a more precise etch.

Figure 1:
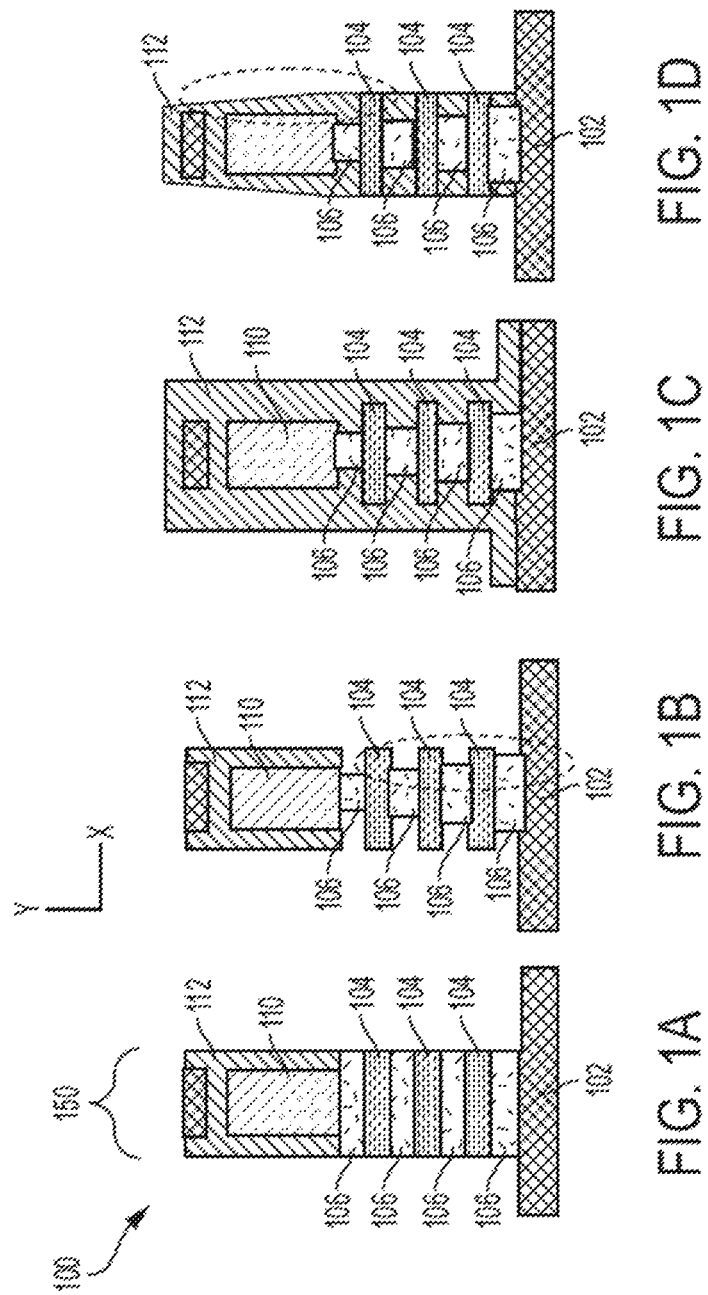
FIG. 1A depicts a nanosheet transistor in the process of being constructed.
FIG. 1B depicts the nanosheet transistor with an uneven indent problem.
FIG. 1C depicts a nanosheet transistor in the process of being constructed.
FIG. 1D depicts the nanosheet transistor with spacer damage.

With reference to FIGS. 1A through 1D, issues arising from current methods will be described. In FIG. 1A, a fin 150 of a nanosheet transistor 100 is illustrated. More particularly, a substrate 102 is present. Above substrate 102 are alternating sheets 104 formed from silicon (Si) and sheets 106 formed from silicon germanium (SiGe). Atop these sheets 104 and 106 is a dummy gate including a polysilicon gate 110 surrounded by a nitride 112. During processing, the SiGe layers 106 are made to be narrower than the Si layers 104 in the X direction. In FIG. 1B, a possible problem of uneven indent is shown. The layers of SiGe are supposed to have an equal width. However, because of the processes used, the layers of SiGe closest to polysilicon gate 110 are narrower than the layers of SiGe near substrate 102.

In FIGS. 1C and 1D, another potential problem is illustrated. These figures illustrate a later step, where silicon nitride (SiN) hard mask 112 extends to the alternating Si layers 104 and SiGe layers 106. FIG. 1C illustrates the gate/Fin profile after conformal inner spacer deposition. In FIG. 1D, it is shown that, SiN layer 112 may or may not have a uniform thickness after the inner spacer etch. This can be referred to as spacer damage and can be caused by process variations. Spacer damage can result in less insulation around the gate, causing contact leakage or otherwise degrading the performance of the transistor.

Figure 2:
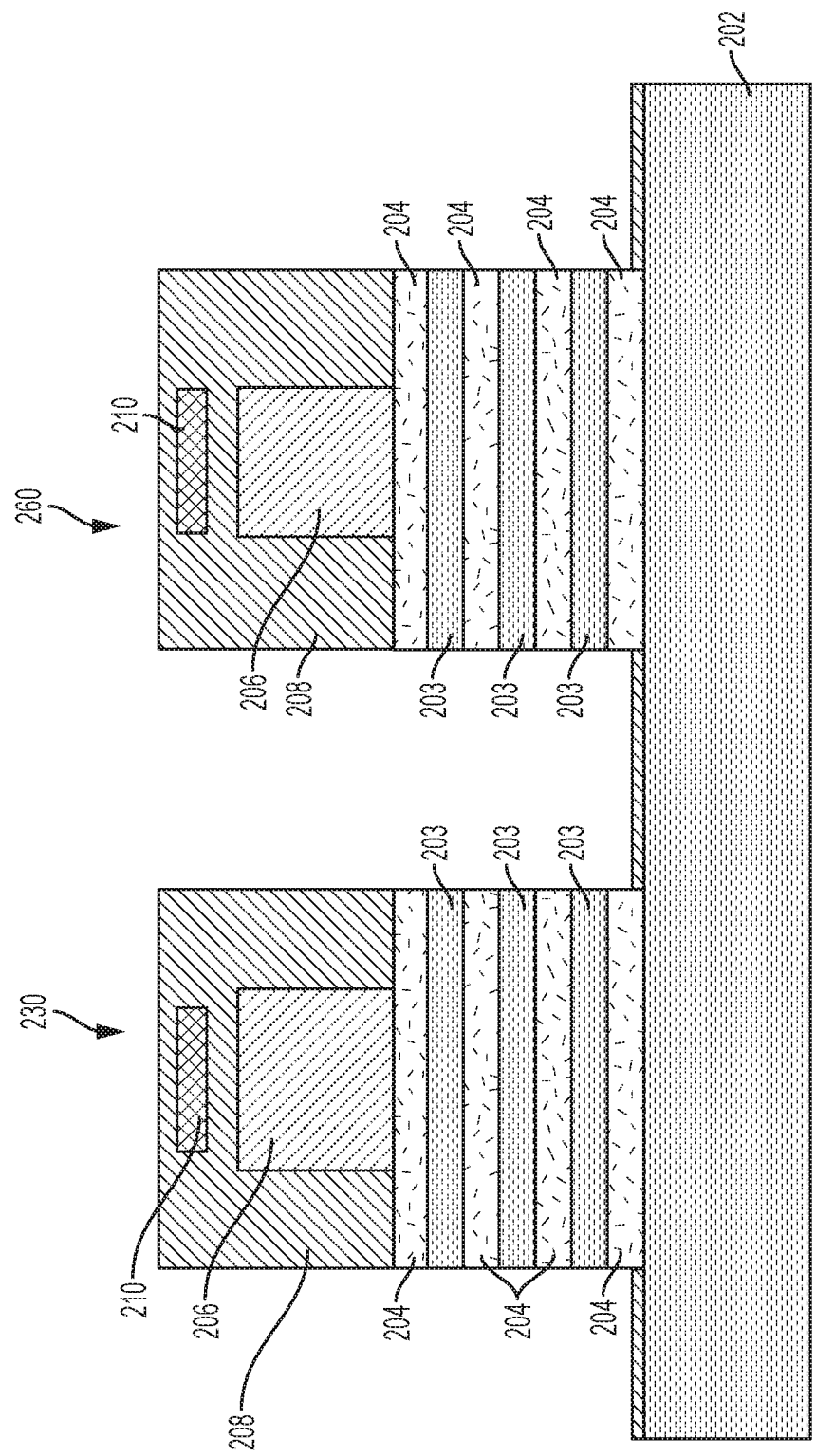
FIG. 2 depicts an assembly of two transistor in the process of being constructed.

Turning now to a more detailed description of an embodiment of the present invention, a fabrication methodology for forming a spacer for a transistor in an integrated circuit package in accordance with one or more embodiments will now be described with reference to FIGS. 2 through 11. Referring now to FIG. 2, an initial structure 200 is illustrated. Structure 200 is a traditional nanosheet structure constructed in one of a variety of different ways, known in the art.

Structure 200 includes two transistors, 230 and 260. These transistors 230 and 260 will be formed on a single substrate 202. At this point in the formation of the transistors, a standard formation process has taken place up to the formation of the gate.

Atop substrate 202 are a series of alternating layers of silicon (Si) 203 and silicon germanium (SiGe) 204, a poly silicon gate 206, a silicon nitride 208, and an oxide hard mask layer 210. Silicon nitride 208 is a spacer to protect the gate 206. The alternating Si layers 203 are the channels, with the SiGe layers 204 acting as sacrificial layers. While three Si layers 203 and four SiGe layers 204 are illustrated in FIG. 2, it should be understood that other numbers of layers can be used in various embodiments.

Figure 3:
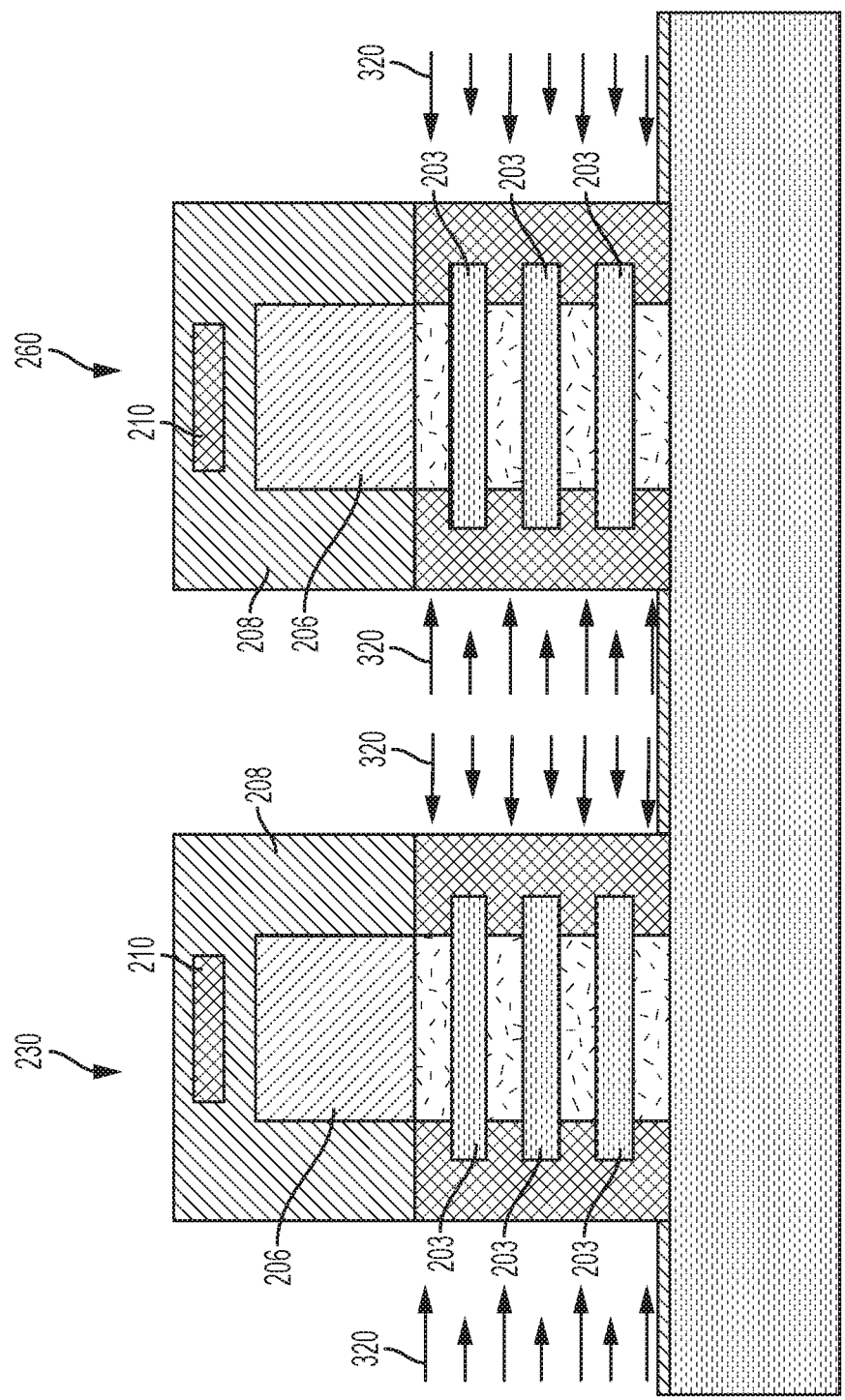
FIG. 3 depicts the two transistors after an oxidation has been performed.

In FIG. 3, the structure is shown after a low-temperature radio frequency (RF) plasma oxidation has been performed. The remaining layers are the same as in FIG. 2. Arrows 320 represent the oxidation that has been performed. This oxidation is intended to affect layers 203 and 204. The temperature of the plasma oxidation is in the range of 200 to 400 degrees Celsius. A low temperature helps to prevent migration of germanium from a SiGE layer 204 to a Si layer 203. The oxidation rates of a Si layer 203 is slower than the oxidation of a SiGe layer 204. This is due to the lower Gibbs free energies for the formation of $GeO_2$, compared to that of $SiO_2$.

Figure 4:
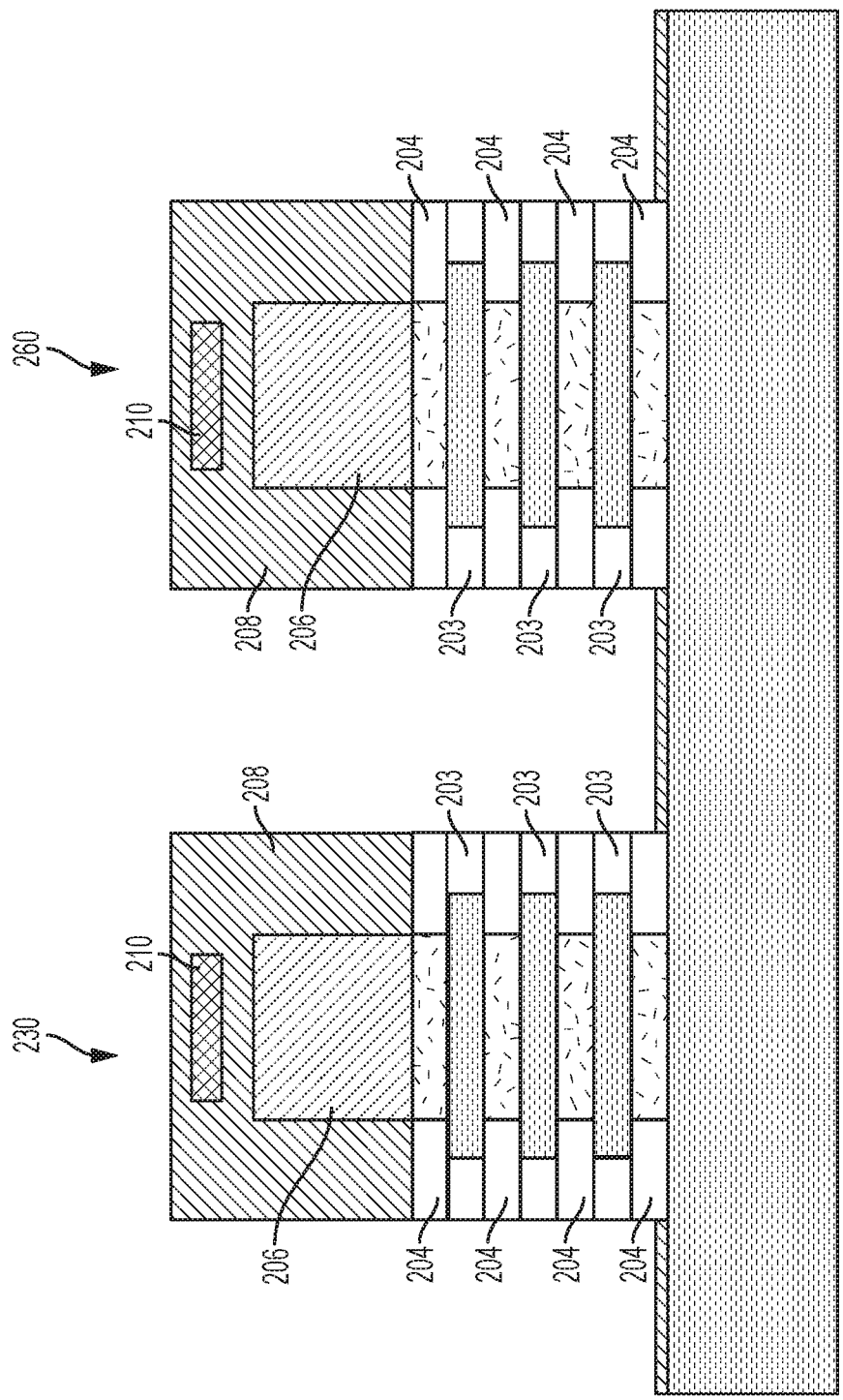
FIG. 4 depicts the two transistors after an etch has been performed.

In FIG. 4, an isotropic oxide etch ($SiO_2$ and $GeO_2$) is performed. This step removes more of SiGe layers 204 than it does the Si layers 203. Because of the oxidation described above with respect to FIG. 3, the result is that each of the SiGe layers 204 have the same amount of material removed, alleviating the problem of top-down variation that was described earlier.

There is an alternative embodiment for the steps illustrated in respect to FIGS. 3 and 4. In the alternative embodiment, an isotropic dry etch is performed. An isotropic dry etch can include the use of ammonia with fluorine as a reaction gas. This type of etch has a good selectivity (i.e., only affecting SiGe layers 204 and not Si layers 203) and results in an improved top-down etch uniformity of SiGe layers 204.

Figure 5:
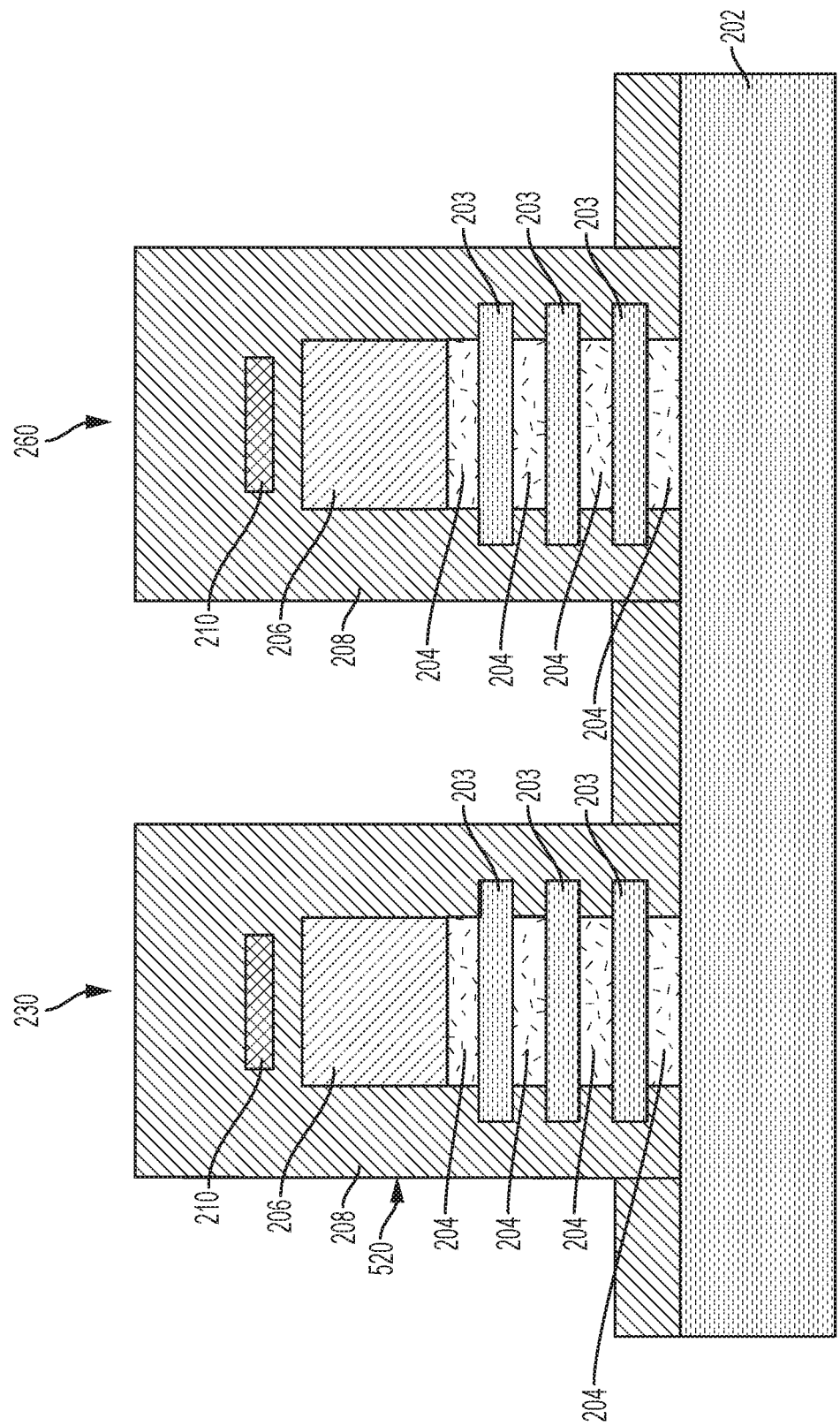
FIG. 5 depicts the two transistors after the deposition of a low-k hard mask layer.

FIG. 5 illustrates the operation after the SiGe layers 204 have been etched, (whether the method of FIGS. 3 and 4 was used or the isotropic dry etch, or any other method now known or developed in the future). In FIG. 5, a deposition of a low-K layer 520 is performed. Layer 520 can include a nitride. Exemplary nitrides can include SiN, atomic layer deposition (ALD) SiBCN, flowable chemical vapor deposition (FCVD) Low-K SiN, and spin-on SiBCN. Nitride 520 serves as a hard mask to protect areas underneath the nitride from various processes.

Figure 6:
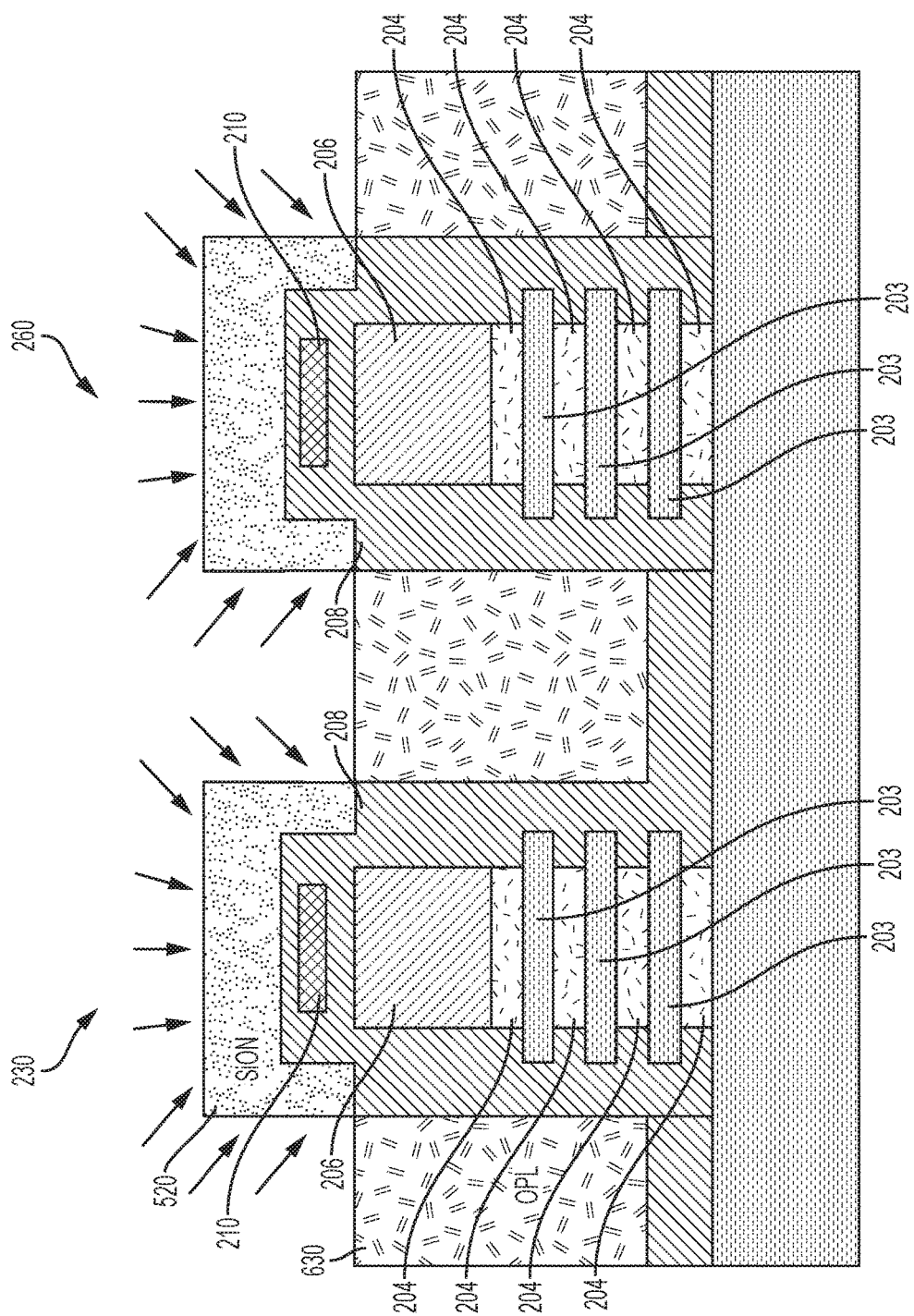
FIG. 6 depicts the two transistors after the addition of an organic planarization layer and an oxygen enriching process on the hard mask.

In FIG. 6, an organic planarization layer (OPL) 630 can be added to protect the fin from downstream ion implantation. In addition, oxygen ions are implanted on layer 520 to form an oxygen-enriched shoulder area of layer 520. This is could be performed by standard ion implantation technique with tilted beam. Such a step can, for example, transform SiN material into SiON. The SiON has a higher etch resistance than does SiN. Therefore, the nitride spacer profile is better preserved in future etching steps than it was in the prior art.

Figure 7:
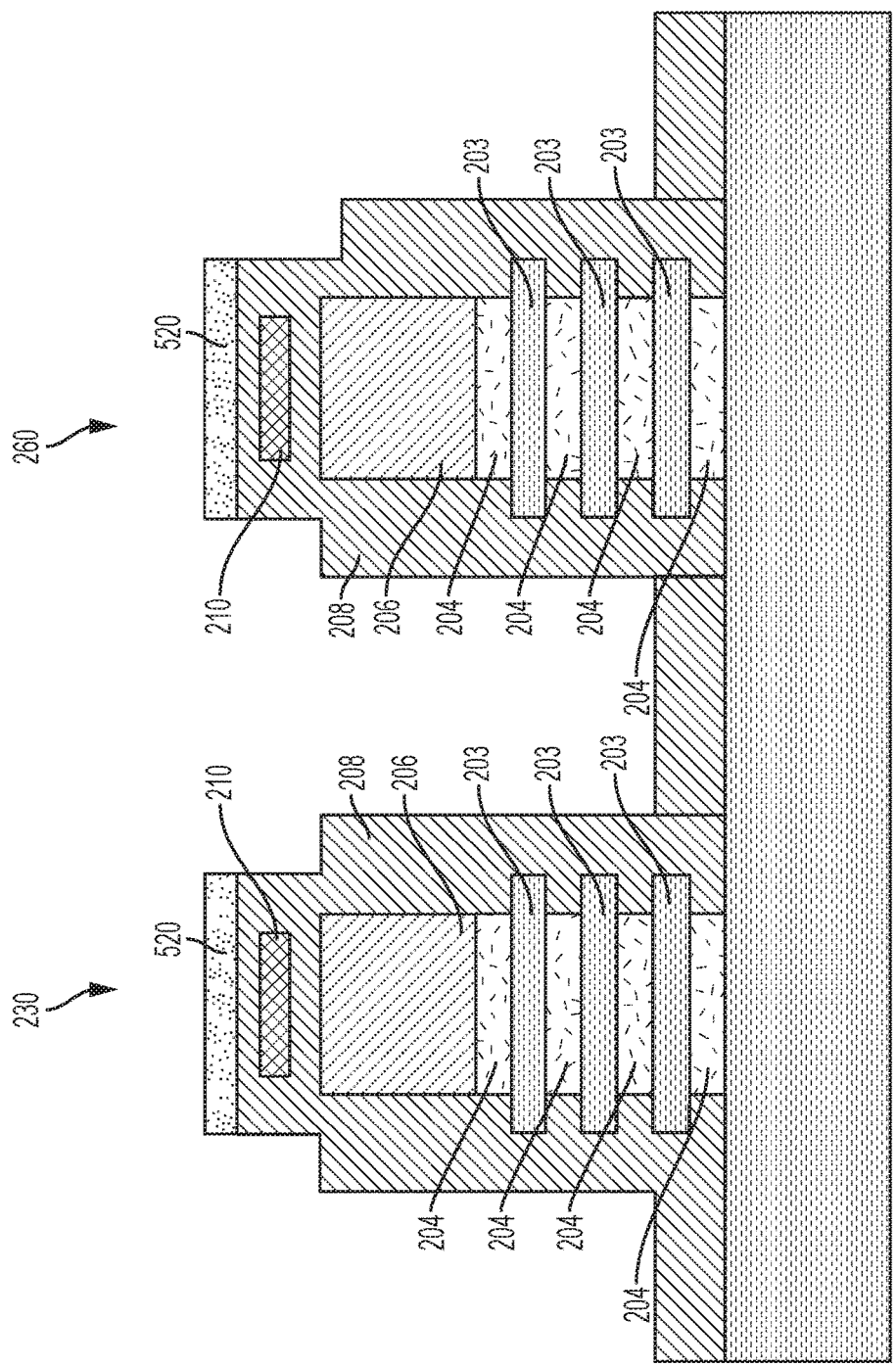
FIG. 7 depicts the two transistors after the removal of the oxygen-enriched hard mask.

In FIG. 7, an isotropic SiON recess is performed to remove SiON from various areas of layer 520, including the sidewall. This process refines the profile of the hard mask layer 520 in preparation for the step described below. This can be a dry etch or a wet etch.

Figure 8:
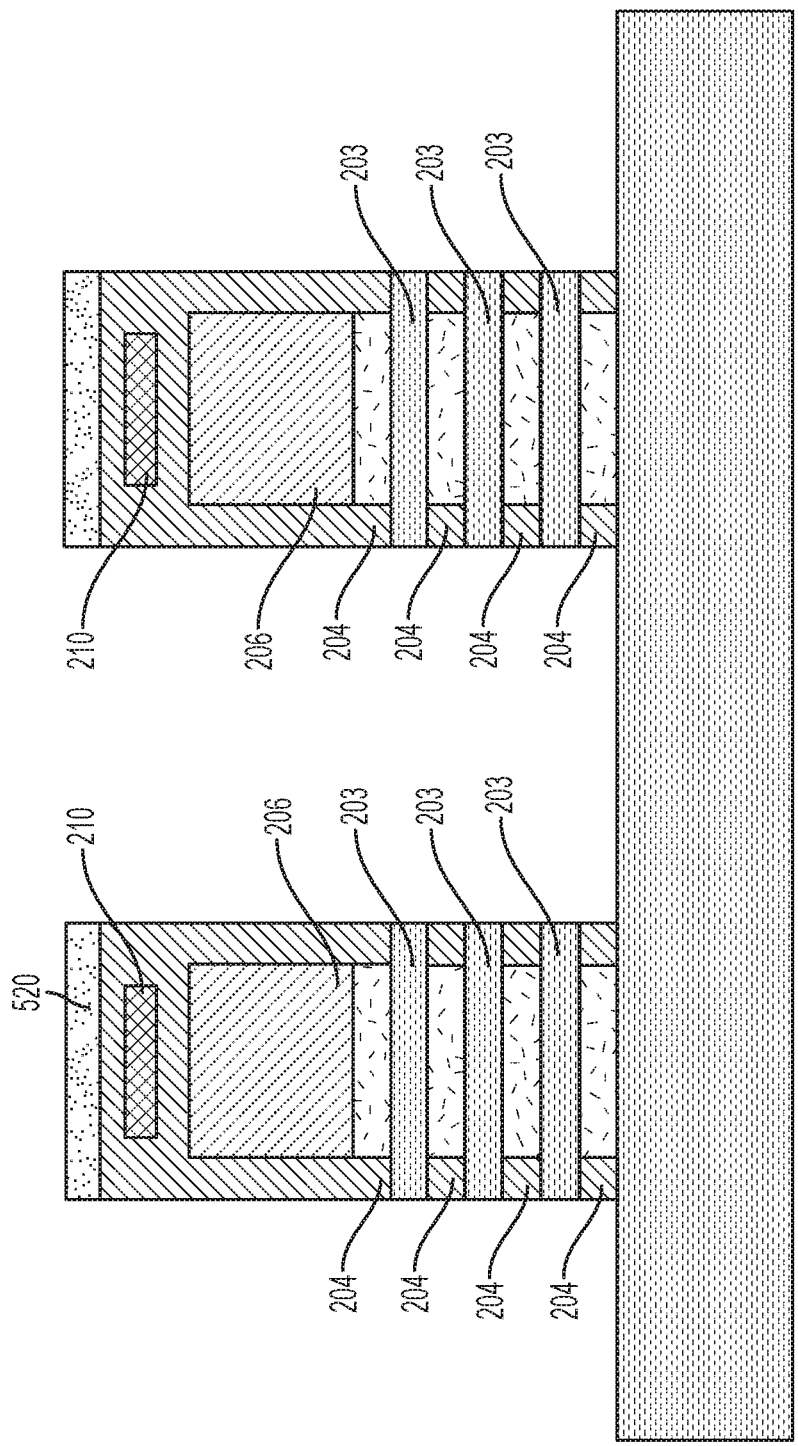
FIG. 8 depicts the two transistors after an etch, such as a reactive ion etch, performed on areas not protected by the hard mask.

In FIG. 8, an etch is performed to remove material that is not protected by the newly oxidized layer 520. In some embodiments, the etch is an anisotropic SiN reactive ion etch (RIE). The oxidized layer 520 hard mask could effectively protect layers underneath oxidized layer 520, such as oxide hard mask layer 210, polysilicon gate 208, SiGe layers 203, and Si layers 204.

Figure 9:
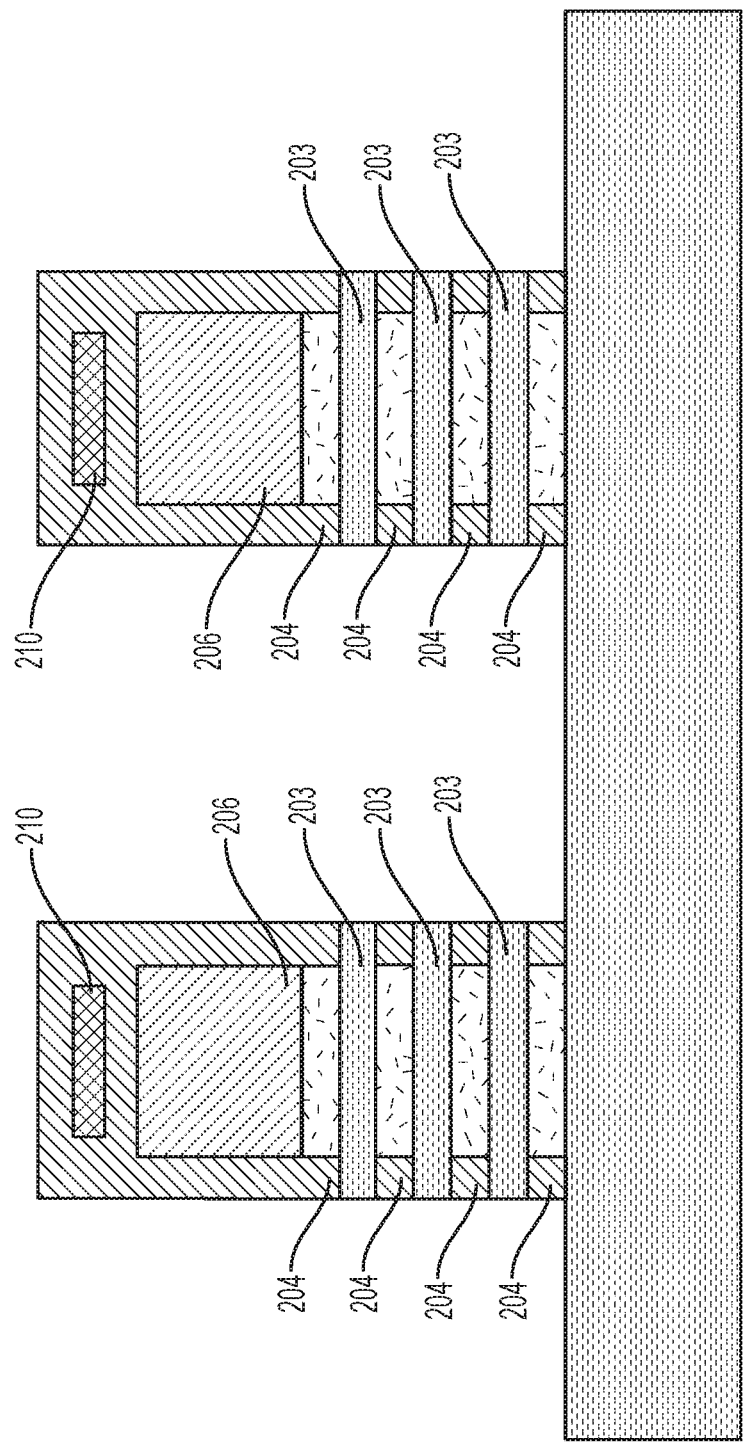
FIG. 9 depicts the two transistors after the removal of the hard mask.

In FIG. 9, an etch has been performed to strip off layer 520. The etch can be a highly selective SiON etch such that it affects only layer 520. Thereafter, traditional processing steps can be performed to finalize the creation of the integrated circuit device.

Figure 10:
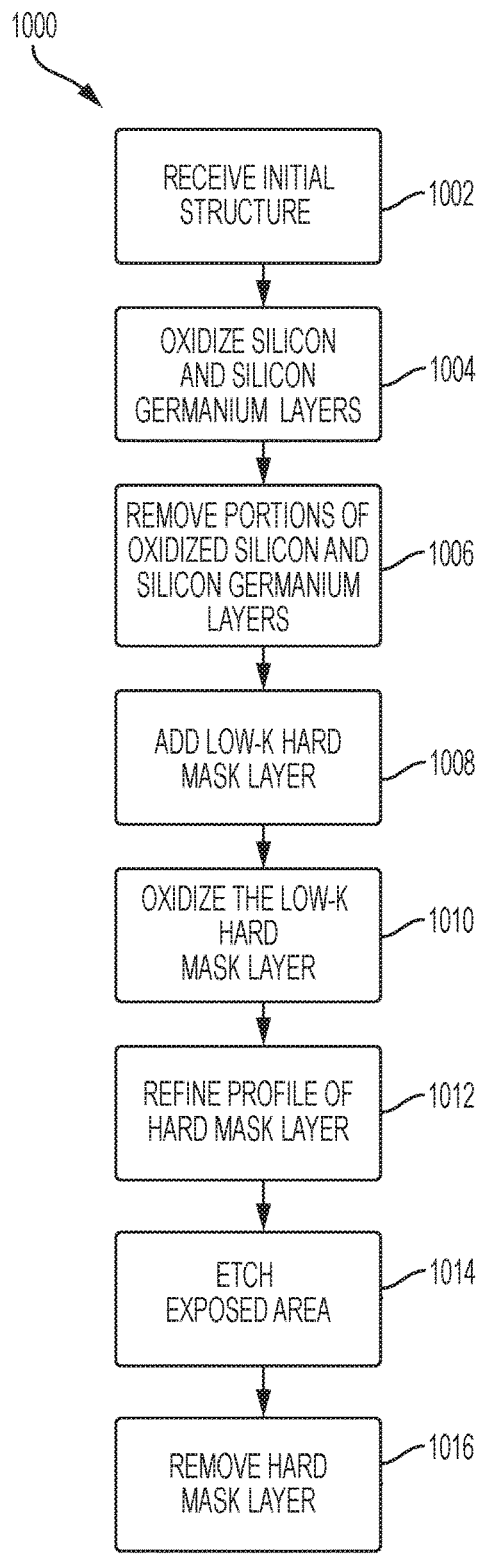
FIG. 10 is a flow diagram illustrating a methodology according to one or more embodiments.

FIG. 10 is a flow diagram illustrating a methodology 1000 according to one or more embodiments. At block 1002, an initial structure is provided. The initial structure includes a nanosheet structure of alternating sheets of silicon germanium and silicon, atop a substrate. A gate structure is located on the nanosheet structure. At block 1004, an oxidation is performed to oxidize the layers of silicon and silicon germanium. At block 1006, an oxide etch is performed to remove portions of the silicon and silicon germanium layers. Due to the structural and oxidation rate differences between the silicon layer and the silicon germanium layer, more of the silicon germanium is removed than the silicon. In addition, relatively equal amounts are removed from each layer, resulting in an elimination of the above-described indent problem. At block 1008, a low-K hard mask layer, such as a nitride, is deposited. At block 1010, oxygen is implanted into the low-K hard mask layer. At block 1012, the profile oxygen enriched hard mask layer is refined to prepare for block 1014, when an etch is performed to remove the areas that are exposed (not covered by the oxygen-enriched hard mask layer). At block 1016, the oxygen enriched hard mask layer is removed. Thereafter, normal processing steps are performed to complete the semiconductor structure.

The resulting structure has none of the issues described above, such as the SiGe indent or the SiN etch-back. Instead, the SiGe layers have roughly the same dimensions and the SiN layer have no etch-back problems.

Thus, it can be seen from the forgoing detailed description and accompanying illustrations that embodiments of the present invention provide structures and methodologies for providing an inner spacer that addresses problems seen in previous implementations.

The descriptions of the various embodiments of the present invention have been presented for purposes of illustration, but are not intended to be exhaustive or limited to the embodiments described herein. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form described herein. Many modifications and variations will be apparent to those of ordinary skill in the art without departing from the scope and spirit of the invention. The embodiment was chosen and described in order to best explain the principles of the inventive teachings and the practical application, and to enable others of ordinary skill in the art to understand the invention for various embodiments with various modifications as are suited to the particular use contemplated.

The diagrams depicted herein are just one example. There can be many variations to this diagram or the operations described therein without departing from the spirit of the invention. For instance, the operations can be performed in a differing order or operations can be added, deleted or modified. All of these variations are considered a part of the claimed invention.

While various embodiments have been described, it will be understood that those skilled in the art, both now and in the future, can make various modifications which fall within the scope of the claims which follow. These claims should be construed to maintain the proper protection for the invention first described.

What is claimed is:

1. A method of forming portions of a transistor, the method comprising:
    performing an oxidation on alternating sheets of silicon and silicon germanium of a nanosheet structure;
    performing an oxide etch to remove portions of the sheets of silicon germanium;
    depositing a hard mask layer on the nanosheet structure;
    adding an organic planarization layer, the organic planarization layer arranged to protect the fin from downstream ion implantation;
    oxidizing the hard mask layer to form an oxygen enriched shoulder area;
    removing portions of the hard mask layer to reveal areas of the nanosheet structure to be etched;
    etching the revealed areas of the nanosheet structure; and
    removing the hard mask layer;
    wherein the oxide etch is an isotropic oxide etch ($SiO_2$ and $GeO_2$) that is configured to remove more material from the sheets of silicon germanium than from the sheets of silicon and further configured such that approximately the same amount of material is removed from each sheet of silicon germanium.

2. The method of claim 1 wherein:
performing the oxidation comprises performing a low-temperature radio-frequency plasma oxidation.

3. The method of claim 2 wherein:
the low-temperature radio-frequency plasma oxidation is configured to oxidize the sheets of silicon germanium more than the sheets of silicon.

4. The method of claim 1 wherein:
the oxide etch is an isotropic dry oxide etch configured to remove more material from the sheets of silicon germanium than the sheets of silicon.

5. The method of claim 4 wherein:
the isotropic dry etch comprises the use of ammonia with fluorine as a reaction gas.

6. The method of claim 1 wherein:
a dummy gate structure is positioned above the alternating sheets of silicon and silicon germanium.

7. The method of claim 1 wherein:
the hard mask layer is a nitride.

8. The method of claim 7 wherein:
the hard mask is selected from SiN, atomic layer deposition (ALD) SiBCN, flowable chemical vapor deposition (FCVD) Low-K SiN, and spin-on SiBCN.

9. The method of claim 7 wherein:
oxidizing the hard mask layer comprises using a standard ion implantation technique to transform the nitride hard mask into an oxidized nitride hard mask that has greater etch resistance.

* * * * *